United States Patent [19]
Togneri et al.

[11] 3,942,095
[45] Mar. 2, 1976

[54] AC-TO-DC CONVERTER SYSTEM

[76] Inventors: Mauro Guiseppe Togneri, 7626 Westwind, Houston, Tex. 77071; Harry Samuel Elliott, 12914 Jebbia Lane, Stafford, Tex. 77477

[22] Filed: Aug. 20, 1974

[21] Appl. No.: 498,958

[52] U.S. Cl. .................... 321/47; 307/260; 321/18; 324/119; 328/26
[51] Int. Cl.² ......................................... H02M 7/44
[58] Field of Search ........ 307/260, 261; 321/47, 18; 324/119; 328/26

[56] References Cited
UNITED STATES PATENTS 3,825,816   7/1974   Togneri et al. .................... 321/47 X

*Primary Examiner*—William M. Shoop
*Attorney, Agent, or Firm*—Pugh & Keaty

[57] ABSTRACT

A signal conversion system wherein variable amplitude alternating current signals from instrument sensors, which represent the magnitude of measured physical variables or control signals by amplitude modulated alternating current voltage signals, are converted to variable amplitude direct current or voltage signals (FIG. 1). The input signal is filtered for normal mode noise and capacitor isolated for common mode noise. The conversion process also includes magnitude scaling of the variable amplitude input signal, including but not limited to, square root extraction and linear amplitude adjustment.

19 Claims, 1 Drawing Figure

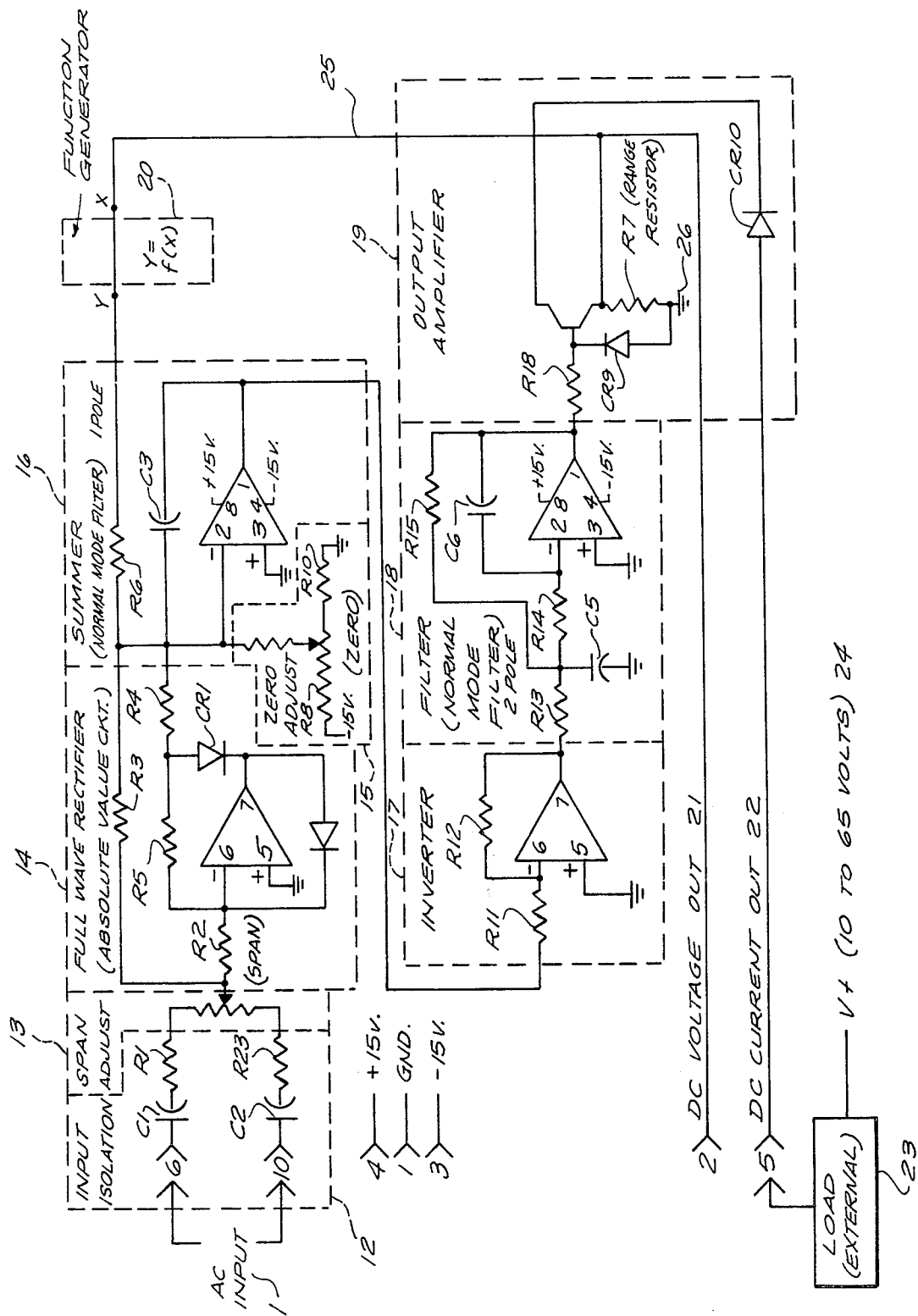

AC-TO-DC CONVERTER SYSTEM

CROSS-REFERENCE TO RELATED APPLICATION

U.S. Pat. application Ser. No. 379,331, filed Apr. 26, 1973 by Mauro G. Togneri and Harry S. Elliott and entitled "DC-TO-AC AND AC-TO-DC CONVERTER SYSTEMS," now U.S. Pat. 3,825,816, issued July 23, 1974.

BACKGROUND AND SUMMARY OF THE INVENTION

The present invention relates to an electronic signal conversion system which includes an electrical signal to be converted and provides a unique and particularly useful way of converting the value of the signal, which is represented by the magnitude of the signal to be converted, said signal being alternating current (hereinafter AC), to a corresponding value of that signal, which is represented by the magnitude of the converted signal, said signal being direct current (hereinafter DC).

Heretofore, several systems for handling this type of electrical conversion have been taught by the prior art. Probably the best known systems of this type take a fixed amplitude AC signal and convert it to a fixed amplitude DC signal. This type of prior art system has the substantial drawback that it produces a fixed amplitude DC signal as a result of the conversion and requires a fixed amplitude input signal.

Typical examples of other AC-TO-DC Converter devices and methods are shown in U.S. Pat. No. 3,535,556, issued Oct. 20, 1970 to S. R. Hall, U.S. Pat. No. 3,491,252, issued Jan. 20, 1970 to H. Petrohilos, U.S. Pat. No. 3,721,891, issued Mar. 20, 1973 to A. J. Moses, U.S. Pat. No. 3,652,945, issued Mar. 28, 1972 to H. Nakane et al., U.S. Pat. No. 3,564,389, issued Feb. 16, 1971 to P. L. Richmond U.S. Pat. No. 3,488,598, issued Jan. 6, 1970 to E. Hoo, and U.S. Pat. No. 3,373,334, issued Mar. 12, 1968 to E. W. Geisz, et al.

The Hall, Petrohilos, and Moses AC-TO-DC Conversion devices convert variable frequency periodic inputs to their RMS or absolute value through the use of reference signals and other circuit means. The Hall AC-TO-DC Converter produces a pulse train rather than a DC output. The Petrohilos device produces a DC output proportional to the average value of the input. The Moses device produces a DC output proportional to the amplitude of an AC Input for a frequency of AC Input introduced into the device without the use of feedback. The drawback with any of these devices is that they have no isolation, are inaccurate, have no offset adjustment, and are not specifically directed at a single frequency input. Additionally, they do not produce a current output and require a reference signal.

The Nakane and Richmond devices convert broad frequency AC inputs to a DC RMS value without the use of a reference signal. However, neither of these devices is capable or discloses a method of producing current output; they both lack DC isolation; they both lack offset adjustment; and they are useful only in broad frequency inputs and do not deal with a single AC frequency input.

The Hoo and Geisz devices convert fixed frequency AC signals to DC signals. These systems take a fixed amplitude AC signal and convert it to a fixed amplitude DC signal for either power regulation or frequency control. This type of prior art system has a substantial drawback in that it produces a fixed amplitude DC signal as a result of the conversion and requires a fixed amplitude input signal, as well as a lack of accuracy and offset adjustment.

In the present invention, the input signal for any pre-determined range and frequency is introduced into the AC-TO-DC Converter wherein the signal is isolated, and normal and common mode noise eliminated. The AC-TO-DC Converter then rectifies, scales, filters, shapes, and amplifies the input signal to the form necessary or desirable for the output signal. There is no mechanical coupling and all input and output signals are allowed to be variable within predefined ranges. The present invention is completely electronic through the use of novel circuit techniques.

BRIEF DESCRIPTION OF THE DRAWINGS

For a further understanding of the nature and objects of the present invention, reference should be had to the following detailed description, taken in conjunctions with the accompanying drawing, wherein:

FIG. 1 is a block and circuit diagram of the preferred embodiment of the AC-TO-DC Converter System of the present invention in generalized form for conversion of an AC variable amplitude signal to a DC variable amplitude signal.

DETAILED DESCRIPTION OF THE PREFERRED EMBODIMENT

Introduction

The AC-TO-DC Converter System of the present invention can be utilized as an AC-TO-DC Converter device for any sort of conversion operation wherein a variable amplitude alternating signal of a predetermined range of signal amplitude is to be converted to a variable amplitude direct current or voltage signal (FIG. 1). A particularly important area of application is the conversion of 60 hertz, variable amplitude, alternating signals, which represent the magnitude of measured physical variables or control signals by amplitude modulated alternating voltage signals, to variable amplitude direct current or voltage signals, and therefore the preferred embodiment of the present invention will be described with respect to such an application. However, it should be realized that the present invention could be applied to, for example, any application where it is desired to translate variable amplitude alternating signals to variable amplitude direct current or voltage signals.

Structure and Method of Use

FIG. 1 illustrates the AC-TO-DC Converter System (hereinafter AC system) of the present invention in a generalized block diagram form. In order to best understand the principles of the present invention, a brief description of the components of FIG. 1 is given below in tabular form.

The components of FIG. 1 are:

11: AC Input Signal. The input which is an AC signal that can be of any predetermined range, such as, for example, zero to forty volts, within the limits of the amplifiers, capacitors, and resiistors accordingly selected.

12: Input Isolation Means. Input isolation means isolates the AC signal input from the other parts of the system 13, 14, 15, 16, 17, 18, 19, 20, 21, 22, 23, 24, and 25. The isolation is usually accomplished through capacitor and resistor coupling.

13: Span Adjustment Means. Span adjustment means scales the DC voltage output 21 and the DC current output 22 to the appropriate preset range corresponding to the range of the AC input signal 11 by altering the range of the output from the input isolation means 12.

14: Full Wave Rectification Means. Full wave rectification means converts the signal from the span adjustment means 13 to a rectified form thereby generating a DC component to the signal. Rectification is usually accomplished through the use of a high gain amplifier with resistor and diode feedback.

15: Zero Adjustment Means. Zero adjustment means adjusts the input of the summer means 16 in such a manner that the lowest expected value of the AC input signal 11, such as, for example, zero volts, produces a predetermined value of output, such as, for example, 4 milliamps for DC current output 22 and DC voltage output.

16: Summer Means: Summer means filters normal mode noise with a single pole from the full wave rectifier means 14, as well as, aid in function shaping of the signal in conjunction with function generator means 20. Summer means is usually made up of a high gain amplifier with capacitor and resistor feedback.

17: Inverter Means. Inverter means changes the sign of the signal from the summer means 16 to keep the signal stable by having the proper sign for use as DC signal voltage feedback 25.

18: Filter Means. Filter means is a two pole filter used as the filter to reduce the amount of non DC component of the inverter 17 output to the input side of the output amplifier 19. Filtering is usually accomplished through the use of a high-gain amplifier with resistor and capacitor input and resistor and capacitor feedback.

19: Output Amplifier Means. The Output Amplifier means scales the functionally shaped, rectified, and filtered signal to the appropriate level for output as a DC voltage output 21 and a DC current output 22 and provides feedback signal 25 to function means 20.

20: Function Means. Function means shapes the rectified, filtered, and amplified signal to whatever form is desirable such as, for example, square root extraction. Function shaping is performed by a set of high gain amplifiers, the number of amplifiers and feedback components being chosen for the function selected.

21 & 22: DC Voltage Output and DC Current Output. The final output of the AC-TO-DC Converter System is a DC signal that can be of any predetermined range, such as, for example, 1 to 5 volts, 4 to 20 milliamps, 10 to 50 milliamps, or 1 to 5 milliamps. The scaling is performed by resistor R7 in output amplifier means 19.

23 & 24: External Load and Voltage Source. The DC signal current output 22 would be used to regulate the current from any voltage source through an external load to ground 26 through output amplifier means 19. The DC voltage signal output 21 is a voltage relative to ground 26 dependent on the AC input signal 11.

25: DC Signal Voltage Feedback. DC voltage feedback is used in conjunction with function means 20 and summer means 16 to filter the rectified AC input signal 11 and shape it for the function defined in the function means 20.

Using the component nomenclature of FIG. 1, the variable magnitude AC signal input 11 is introduced to the input isolation means, 12, such as a capacitor, which subtracts any DC common mode noise in the input. The signal is then introduced to the span adjustment means 13 to adjust the isolated signal to the proper output scaling. The signal is then introduced to the AC rectification means 14 to rectify the AC signal while still preserving the amplitude relationship to the original AC input signal. The signal is then offset by the zero adjust means 15 to obtain the proper signal level necessary at the DC voltage output 21 or DC current output 22 when the AC input signal 11 is at its lowest predetermined point in the range. The signal is then introduced into the summer means 16 to eliminate the remaining noise components and perform some of the scaling of the signal to the appropriate output range while still preserving the amplitude relationship to the original AC signal 11. The signal is then introduced in the inverter means 17 where the sign of the signal is changed. The signal is then introduced into the filter means 18 where the majority of the rest of the non DC components of the signal is filtered from the signal before the signal is permitted to be introduced to the output amplification means 19 where the signal is scaled to the DC voltage output 21 and DC current output 22. If DC current output 22 is used, then an external voltage reference 24 and an external load 23 will also be used to permit the current to flow. DC voltage output signal 21 is also fed back as a signal 25 to the function means 20, if any additional scaling, such as, for example, square root, is needed, in order to perform the functional scaling. The output from function means 20 is introduced as one of the signals to the summer means 16 so that the properly scaled signal will be sent from there to the inverter means 17, filter means 18, and output amplifier means 19.

Because many varying and different embodiments may be made within the scope of the inventive concepts herein taught, such as types of function scaling and range of the AC input signal, and because many modifications may be made in the embodiments herein detailed in accordance with the descriptive requirements of the law, it is to be understood that the details herein are to be interpreted as illustrative and not in a limiting sense.

What is claimed as invention is:

1. An AC-TO-DC Converter system for converting a variable magnitude alternating current signal input of a single predominant frequency to a variable magnitude direct current signal output, comprising:

input isolation, rectification, and filter means for isolating and rectifying and filtering such variable magnitude alternating current input signal;

amplification means for amplifying the signal from said input isolation, rectification and filter means to the appropriate output range, said input isolation, rectification, and filter means being electrically connected between such alternating current input and said amplification means, and said amplifier means being electrically connected between said input isolation, rectification, and filter means and such direct current signal output; and function and feedback means for signal shape and magnitude adjustment determined by a predefined function in the system to shape such direct current output signal and introduce it back to the input isolation, rectification, and filter means, said function and feedback means being electrically connected between the direct current signal output and said input isolation, rectification, and filter means.

2. The AC-TO-DC Converter system of claim 1 wherein said function and feedback means is equality.

3. The AC-TO-DC Converter system of claim 1 wherein said input isolation, rectification, and filter means also includes an adjustment means for adjustment of the span of the variable magnitude direct current signal output.

4. The AC-TO-DC Converter system of claim 1 wherein said input isolation, rectification, and filter means also includes zero adjustment means for adjusting the minimum magnitude of the direct current output signal.

5. An AC-TO-DC Converter system for converting a variable magnitude alternating current signal input of a single frequency that is to be converted to a variable magnitude direct current signal output comprising the following interconnected electrical components:
  input isolation means for electrically isolating the variable magnitude input signal from the rest of the system;
  AC rectification means for establishing a direct current component to the variable magnitude alternating current signal input, said input isolation means being electrically connected between the variable magnitude alternating current signal input and said AC rectification means;
  summer means for filtering non direct current components from the signal and for introducing functionally shaped signals into the isolated and rectified variable magnitude alternating current signal input, said AC rectification means being electrically connected between said input isolation means and said summer means;
  inverter means for changing the sign of the output from said summer means, said summer means being electrically connected between said AC rectification means and said inverter means;
  filter means for filtering the remaining unacceptable non direct current components of the signal from the said inverter means, said inverter means being electrically connected between said summer means and said filter means;
  output amplifier means for amplifying the signal from said filter means to the appropriate output range for the variable magnitude direct current signal output, said output amplifier means being connected between said filter means, and the variable magnitude direct current signal output;
  function means for signal and magnitude adjustment determined by a predefined function in the system, said function means being connected between the variable magnitude direct current signal output and the input of said summer means.

6. The AC-TO-DC Converter system of claim 5 wherein said function means produces an equality relationship.

7. The AC-TO-DC Converter system of claim 5 wherein said function means produces a square root function relationship.

8. The AC-TO-DC Converter system of claim 5 wherein there is also included an adjustment means for adjustment of the span of the variable magnitude direct current signal output.

9. The AC-TO-DC Converter system of claim 5 wherein there is also included zero adjustment means for offsetting the output of said AC rectification means by a fixed direct current component to correspond to the required magnitude of the variable magnitude direct current signal output for the lowest value of the variable magnitude alternating current signal input, said zero adjustment being electrically connected to the input of said summer means.

10. The method of converting variable magnitude alternating current inputs to corresponding variable magnitude direct current outputs comprising the steps of:
  a. Feeding the variable magnitude alternating current signal input to an input isolation, rectification, and filter circuit;
  b. Producing an isolated, rectified, and filtered direct current signal whose magnitude has a fixed relationship to the magnitude of the input alternating current signal including function shaping;
  c. Feeding said produced signal of step b to an output amplifier circuit for amplifying said produced signal of step b to the proper range for the variable magnitude direct current signal output, the output of the circuit comprising the variable magnitude direct current signal output; and
  d. Feeding the signal produced in step c to a function shaping circuit to produce a second signal for feeding into the circuit of step a where said output signal of the function shaping circuit is used to produce a magnitude adjustment to the produced signal of step b determined by a predetermined function.

11. The method of claim 10 wherein the function shaping circuit is an equality circuit.

12. The method of claim 10 wherein the function shaping circuit is a square root circuit.

13. The method of claim 10 wherein the input isolation, rectification, and filter circuit also includes a span adjustment circuit to obtain the proper span for the variable magnitude direct current signal output.

14. The method of claim 10 wherein the input isolation, rectification, and filter circuit also includes a zero adjustment circuit to raise the direct current component of the produced signal of step b by an amount corresponding to the lowest magnitude of the variable magnitude direct current signal output that would be produced for the lowest magnitude anticipated for the variable magnitude alternating current signal input.

15. The method of converting variable magnitude alternating direct current signal inputs to corresponding variable magnitude direct current signal outputs comprising the steps of:
  a. feeding the variable magnitude alternating current signal input to an input isolation circuit;
  b. producing an isolated input signal;
  c. feeding said isolated input signal to an alternating current rectification circuit to produce a signal with a direct current component;
  d. feeding the produced signal of step c to a summer circuit to filter the non direct current component of the signal produced in step c and to adjust said signal produced in step c by the output of a function shaping circuit to produce a magnitude adjustment in the produced signal of step *c* determined by a predetermined function in the system;

e. feeding the produced signal of step *d* to an inverter circuit for changing the sign of the produced signal of step *d*;

f. feeding the produced signal of step *e* to a filter circuit for filtering the remaining unacceptable alternating current components of the signal produced in step *e*;

g. feeding the produced signal of step *f* to an output amplifier circuit for amplifying the produced signal of step *f* to the proper range for the variable magnitude direct current signal output, the output of the circuit comprising the variable magnitude direct current signal output; and h. Feeding said output of step g to a function shaping circuit to produce a signal for step d where said signal is used to produce a magnitude adjustment to the produced signal of step c determined by the predetermined function.

16. The method of claim 15 wherein the function shaping circuit is an equality circuit.

17. The method of claim 15 wherein the function shaping circuit is a square root circuit.

18. The method of claim 15 wherein there is added the additional step of adjusting the signal of step *b* by a span adjustment circuit to obtain the proper span for the variable magnitude direct current signal output before the signal of step *b* is fed to step *c*.

19. The method of claim 15 wherein the additional step of adjusting the produced signal of step *c* is added through a zero adjustment circuit before the signal is fed to step *d* in order to raise the direct current component of the produced signal of step *c* by an amount corresponding to the lowest magnitude of the variable magnitude direct current signal output that would be produced for the lowest magnitude anticipated for the variable magnitude alternating current signal input.

* * * * *